(12) United States Patent
Goda et al.

(10) Patent No.: US 8,369,158 B2
(45) Date of Patent: Feb. 5, 2013

(54) ERASE OPERATIONS AND APPARATUS FOR A MEMORY DEVICE

(75) Inventors: Akira Goda, Boise, ID (US);
Giuseppina Puzzilli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 12/646,136

(22) Filed: Dec. 23, 2009

(65) Prior Publication Data

US 2011/0149659 A1    Jun. 23, 2011

(51) Int. Cl.
*G11C 11/34* (2006.01)
(52) U.S. Cl. .................................. 365/185.29; 365/218
(58) Field of Classification Search ............. 365/185.29, 365/218
See application file for complete search history.

(56) References Cited

U.S. PATENT DOCUMENTS

| | | | |
|---|---|---|---|
| 2006/0158937 A1* | 7/2006 | Hazama et al. | .......... 365/185.18 |
| 2007/0047327 A1 | 3/2007 | Goda et al. | |

* cited by examiner

*Primary Examiner* — Anthan Tran
(74) *Attorney, Agent, or Firm* — Leffert Jay & Polglaze, P.A.

(57) ABSTRACT

Erase operations and apparatus configured to perform the erase operations are suitable for non-volatile memory devices having memory cells arranged in strings. One such method includes biasing select gate control lines of a string of memory cells to a first bias potential, biasing access lines of a pair of the memory cells to a second bias potential and biasing access lines of one or more remaining memory cells to a third potential. A ramping bias potential is applied to channel regions of the string of memory cells substantially concurrently with or subsequent to biasing the select gate control lines and the access lines, and floating the select gate control lines in response to the ramping bias potential reaching a release bias potential between an initial bias potential of the ramping bias potential and a target bias potential of the ramping bias potential.

33 Claims, 17 Drawing Sheets

| | PWELL | SGS/SGD | WL0/129 | WL1/128 | WL2–WL127 | BLK_EN | GSGS/GSGD | GWL0/GWL129 | GWL1/GWL128 | GWL2/GWL127 |
|---|---|---|---|---|---|---|---|---|---|---|
| T1 | 0V | 0V | 0V | 0.5V | 1.5V | 3V | 0V | 0V | 0.5V | 1.5V |
| T2 | 0V TO 5V | 0V | 0V | 0.5V | 1.5V | 3V | 0V | 0V | 0.5V | 1.5V |
| T3 | 5V TO 15V | 0V TO 10V (FLOATING) | 0V | 0.5V | 1.5V | 3V | 0V TO 3V | 0V | 0.5V | 1.5V |
| T4 | 15V TO 25V | 10V TO 20V (FLOATING) | 0V TO 10V (FLOATING) | 0.5V | 1.5V | 3V | 3V | 0V TO 3V | 0.5V | 1.5V |
| T5 | 25V | 20V (FLOATING) | 10V (FLOATING) | 0.5V | 1.5V | 3V | 3V | 3V | 0.5V | 1.5V |

FIG 7

| | PWELL | SGS/SGD | WL0/129 | WL1/128 | WL2 – WL127 | BLK_EN | GSGS/GSGD | GWL0/ GWL129 | GWL1/ GWL128 | GWL2/ GWL127 |
|---|---|---|---|---|---|---|---|---|---|---|
| T1 | 0V | 0V | 0V | 0.5V | 1.5V | 15V | 0V | 0V | 0.5V | 1.5V |
| T2 | 0V TO 15V | 0V TO 10V | 0V TO 5V | 0V TO 0.5V | 1.5V | 15V | 0V TO 10V | 0V TO 5V | 0.5V | 1.5V |
| T3 | 15V TO 25V | 10V TO 20V (FLOATING) | 5V TO 15V (FLOATING) | 0.5V | 1.5V | 15V TO 5V | 10V | 5V | 0.5V | 1.5V |
| T4 | 25V | 20V (FLOATING) | 15V (FLOATING) | 0.5V | 1.5V | 5V | 10V | 5V | 0.5V | 1.5V |

FIG 10

| | PWELL | SGS/SGD | WL0/129 | WL1/128 | WL2 – WL127 | BLK_EN | BLK_EN_SG | GSGS/ GSGD | GWL0/ GWL129 | GWL1/ GWL128 | GWL2/ GWL127 |
|---|---|---|---|---|---|---|---|---|---|---|---|
| T1 | 0V | 0V | 10V | 0.5V | 1.5V | 15V | 3V | 0V | 10V | 0.5V | 1.5V |
| T2 | 0V TO 5V | (FLOATING) | 10V | 0.5V | 1.5V | 15V | 3V | 0V TO 3V | 10V | 0.5V | 1.5V |
| T3 | 15V TO 25V | 20V (FLOATING) | 10V | 0.5V | 1.5V | 15V | 3V | 3V | 10V | 0.5V | 1.5V |

FIG 15

ERASE OPERATIONS AND APPARATUS FOR A MEMORY DEVICE

TECHNICAL FIELD

The present disclosure relates generally to semiconductor memories and, in particular, in one or more embodiments, the present disclosure relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as one or more NAND strings of memory cells 108, for example. The memory cells 102 of the array are arranged together in strings (e.g., NAND strings), typically of 8, 16, 32, or more each. Memory cells of a string are connected together in series, source to drain, between a source line 114 and a data line 116, often referred to as a bit line. Each series string of memory cells is coupled to source line 114 by a source select gate such as select gate 110 and to an individual bit line 116 by a drain select gate 104, for example. The source select gates, such as 110, are controlled by a source select gate (SGS) control line 112 coupled to their control gates. The drain select gates, such as 104, are controlled by a drain select gate (SGD) control line 106. The one or more strings of memory cells are also typically arranged in groups (e.g., blocks) in which the one or more strings coupled to multiple bit lines of a particular group are formed in a common semiconductor material (e.g., common semiconductor well, such as a common p-well) 138 formed in the substrate of the memory device. Due to this commonality of the p-well 138 between the one or more strings of memory cells, each p-well region near each of the memory cell strings has the same potential, such as 0V, or might be biased to a high voltage as part of an erase operation, for example.

The memory array is accessed by a string driver (not shown) configured to activate a logical row of memory cells by selecting a particular access line, often referred to as a word line, such as WL7-WL0 $118_{7\text{-}0}$, for example. Each word line 118 is coupled to the control gates of a row of memory cells 120. Bit lines BL1-BL4 $116_1\text{-}116_4$ can be driven high or low depending on the type of operation being performed on the array. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc.

Programming typically involves applying one or more programming pulses to a selected word line and thus to the control gate of each memory cell coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted for programming. More specifically, the floating gates are typically charged through direct injection or Fowler-Nordheim tunneling of electrons from the channel to the floating gate, resulting in a Vt typically greater than zero in a programmed state, for example. In addition, an inhibit voltage is typically applied to bit lines not coupled to a NAND string containing a memory cell that is targeted for programming.

Memory cells 102 of a selected block are typically erased by first pre-programming all the memory cells of a selected block to bring the memory cells of the selected block to a more uniform state and to help reduce the possibility of over-erasure. The memory cells are erased by driving the p-well 138, and thus the channel regions of the selected block, to an erase voltage, such as 25V, for example. The word lines 118 coupled to the block of memory cells are then typically driven to a lower voltage, such as 1.5V, for example. This applies an erase field across the memory cells sufficient to cause carriers stored in the floating gates and/or charge trapping layers to be removed and the memory cells placed in an erased state with an erased threshold level.

FIG. 2 shows a side view of a single string of memory cells 208, such as string 108 shown in FIG. 1, formed in a p-well 238 during an erase operation performed upon the string of memory cells. The control gates of each memory cell are shown coupled to the word lines $218_{0\text{-}7}$, such as word lines $118_{0\text{-}7}$ as shown in FIG. 1. A source select gate 210 and drain select gate 204 are also illustrated.

During a typical erase operation the p-well 238 is biased to a particular erase voltage, such as 25V, for example, to bias the channel regions of the memory cells. The word lines 218 are also biased to a particular bias level, such as 1.5V. The source select 212 and drain select 206 gate control lines are then left floating in order to disable the source select gate 210 and the drain select gate 204. Resulting from the 25V bias imposed on the p-well 238, the bit line 216 and the source line 214 associated with the NAND string 208 are also biased up to approximately 25V. The proximity of the floating SGS control line 212 to the source line 214 causes the floating SGS control signal line to be coupled up to a potential of approximately 20V, for example. A similar 20V bias condition exists on the floating SGD control line 206 as a result of the proximity to the bit line 216 biased to 25V. This 20V bias condition on the SGS control signal line 212 can cause a higher bias condition (e.g., 3V) to occur on the word line $218_0$ adjacent to the SGS control signal line. A similar effect occurs on the word line $218_7$ adjacent the SGD control signal line 206. The higher bias condition on word lines $218_0$ and $218_7$ (e.g., 3V versus 1.5V as shown in FIG. 2) can cause the memory cells coupled to those word lines to erase slower then word lines $218_{2-6}$, for example. This can result in a particular NAND string of memory cells requiring additional time to complete an erase operation.

For the reasons stated above, and for other reasons stated below which will become apparent to those skilled in the art upon reading and understanding the present disclosure, there is a need in the art for alternate erase operations for memory devices.

BRIEF DESCRIPTION OF THE DRAWINGS

FIG. 7 shows a table of bias conditions corresponding to an erase operation according to an embodiment of the present disclosure.

FIG. 10 shows a table of bias conditions corresponding to an erase operation according to an embodiment of the present disclosure.

FIG. 15 shows a table of bias conditions corresponding to an erase operation according to an embodiment of the present disclosure.

DETAILED DESCRIPTION

Figure 1:
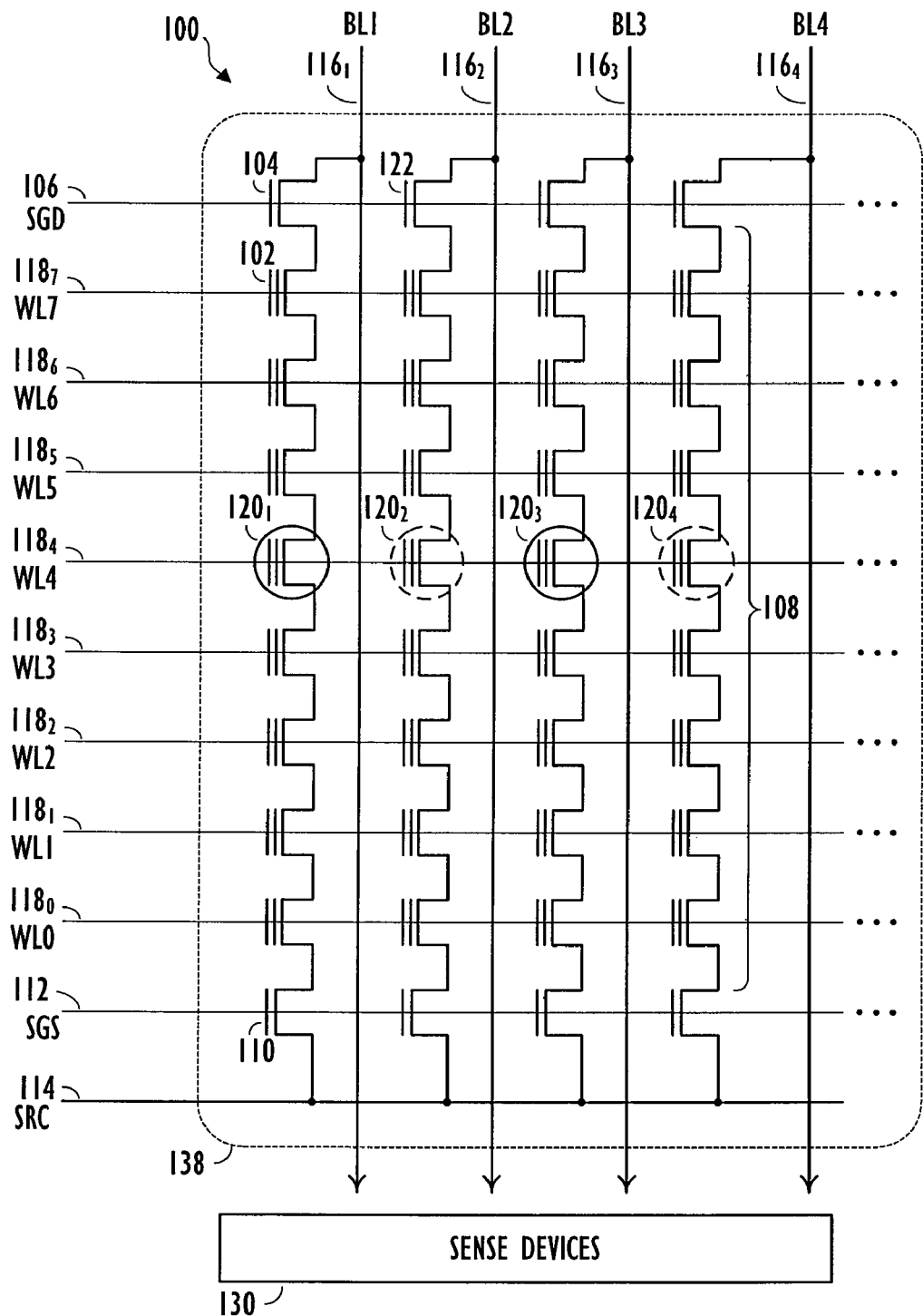
FIG. 1 shows a schematic representation of an array of NAND configured memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense.

Figure 3:
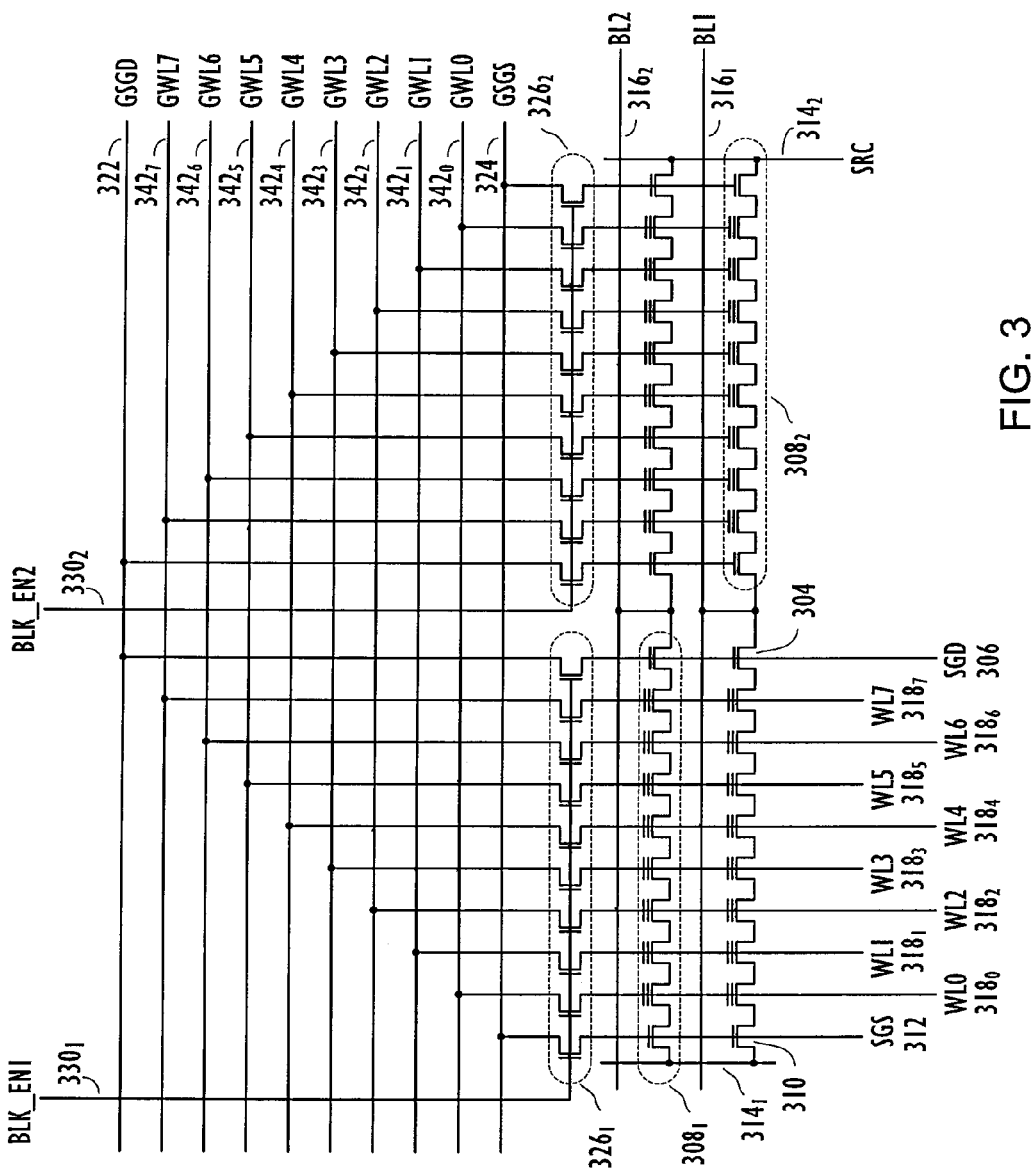
FIG. 3 shows a schematic representation of a plurality of NAND strings of memory cells and associated string driver circuitry.

FIG. 3 illustrates a schematic representation of a plurality of NAND strings of memory cells 308 coupled to local control signals SGS/SGD 312, 306 and local word lines 318. Global control signals GSGS/GSGD 324, 322 are also illustrated. These global signals are coupled to their respective local signals by string drivers 326. String drivers 326 are controlled by the block enable signals BLK_EN1 $330_1$ and BLK_EN2 $330_2$. Typically, when one block enable signal is active, such as BLK_EN1 $330_1$, the adjacent block enable signal $330_2$ is not active so as to deactivate the string drivers $326_2$ coupled to it. This prevents having multiple NAND strings coupled to a common bit line from being active at the same time, for example. Signals GSGD 322, GWL7-GWL0 342 and GSGS 324 are referred to as global signals in that these signals are coupled to multiple blocks of memory cells. For example, NAND string $308_1$ might be part of a first block of memory and NAND string $308_2$ might be part of a second block of memory. Signals SGS 312, WL7-WL0 318 and SGD 306 are referred to as local signals in that these signals are coupled to a single block of memory cells, for example. Thus, the local signals are coupled to the global signals by the string drivers 326. Each NAND string of memory cells 308 is coupled at a first end to a bit line 316 by a drain select gate 304 and is further coupled at the second end of the string to a source line 314 by a source select gate 310 such as discussed above with respect to FIG. 1.

As discussed above with respect to FIG. 2, during a typical erase operation of a selected string of memory cells the SGS 312 and SGD 306 control signals are floating and the word lines 318 are biased to a particular voltage, such as 1.5V, for example. Thus, the string driver transistors 326 coupled to the SGS/SGD signals 312, 306 need to be disabled (e.g., deactivated) and the string driver transistors 326 coupled to the word lines 318 need to be enabled (e.g., activated.) Disabling the string drivers leaves the local signal line in a high impedance (e.g., floating) state. However, the gates of each transistor of a particular group of string drivers 326 are coupled together by a common block enable signal 330. Thus, the bias conditions imposed on each of the global signals are adjusted in order to bias a particular string driver transistor activated or deactivated. For example, BLK_EN1 $330_1$ might be biased to 3V thus biasing the gate of each string driver transistor $326_1$ to 3V. The global signals GSGD 322 and GSGS 324 are also biased to 3V in this example. Thus, the string driver transistors coupled to the block enable signal BLK_EN1 $330_1$ and the GSGS/GSGD signals are disabled. The global word line signals 342 are biased to 1.5V. This results in the string driver transistors coupled to BLK_EN1 and the global word line signals to be enabled. However, as described above, biasing the p-well with an erase voltage and floating the SGS and SGD control signals can cause high voltage coupling to adjacent word lines and affect performance of the erase operation.

Figure 2:
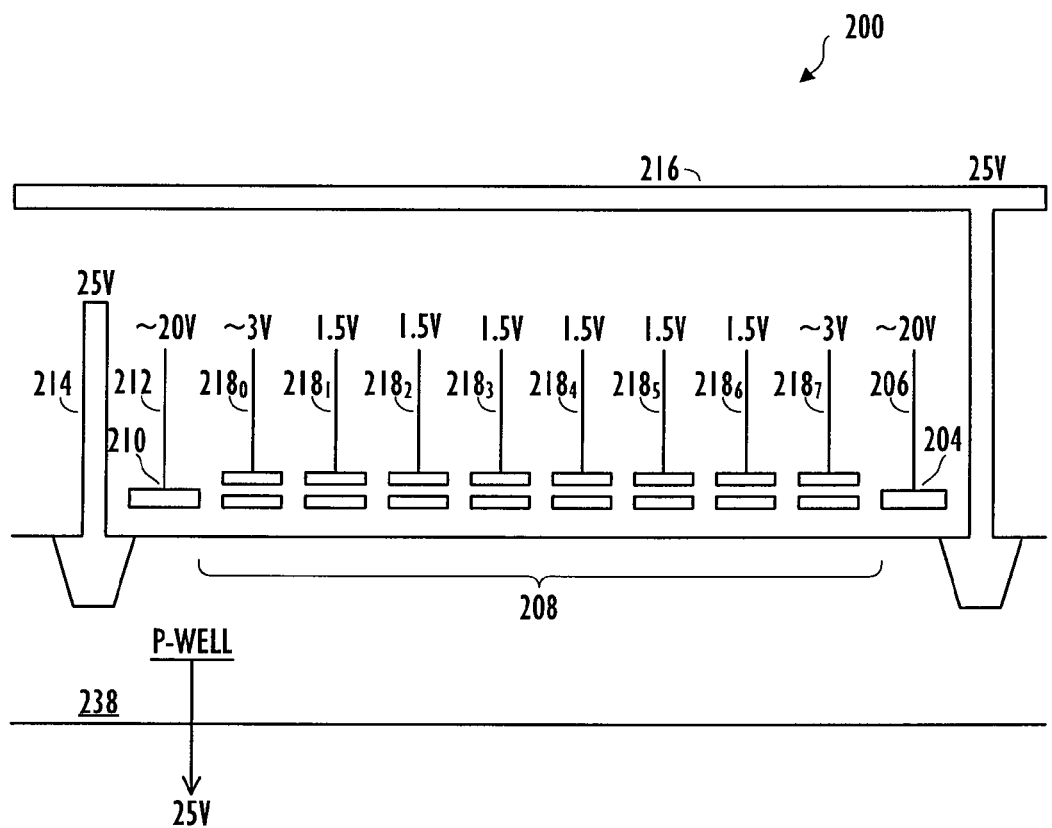
FIG. 2 shows an alternate schematic representation of a string of NAND configured memory cells during an erase operation.
Figure 4:
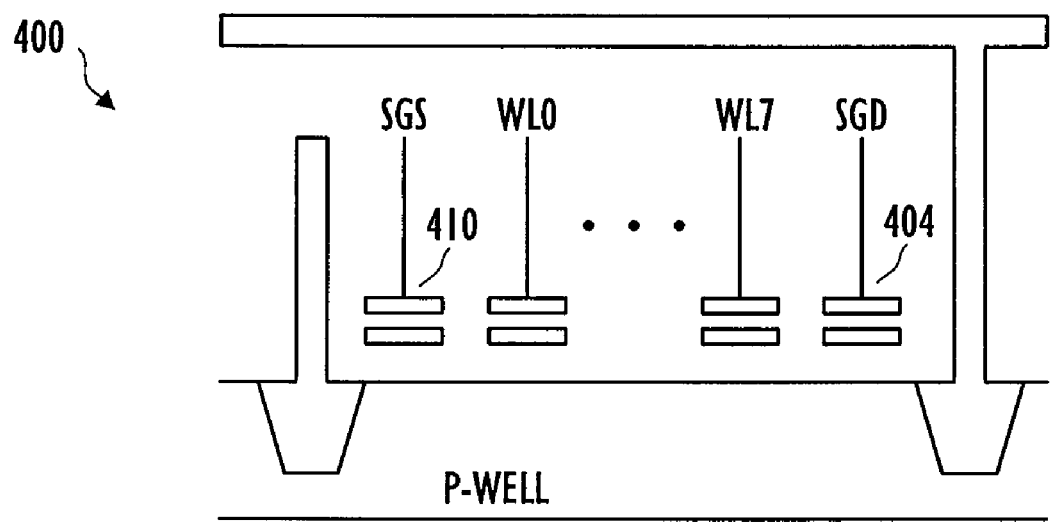
FIG. 4 shows an alternative schematic representation of a string of NAND configured memory cells.

FIG. 4 illustrates an alternate select gate circuit to those shown in FIGS. 2 and 3. Specifically, the source select gate 310 and drain select gate 304 of FIG. 3, can each be implemented with a charge storage node cell, such as a charge trap or floating gate cell as shown in FIG. 4. Thus, the charge storage cell 410 can act as a source select gate and the charge storage cell 404 can act as a drain select gate. The threshold voltages of both charge storage node cells 410 and 404 acting as select gates would be adjusted to a programmed state and are not erased during erase operations performed on the NAND string of memory cells.

Figure 5:
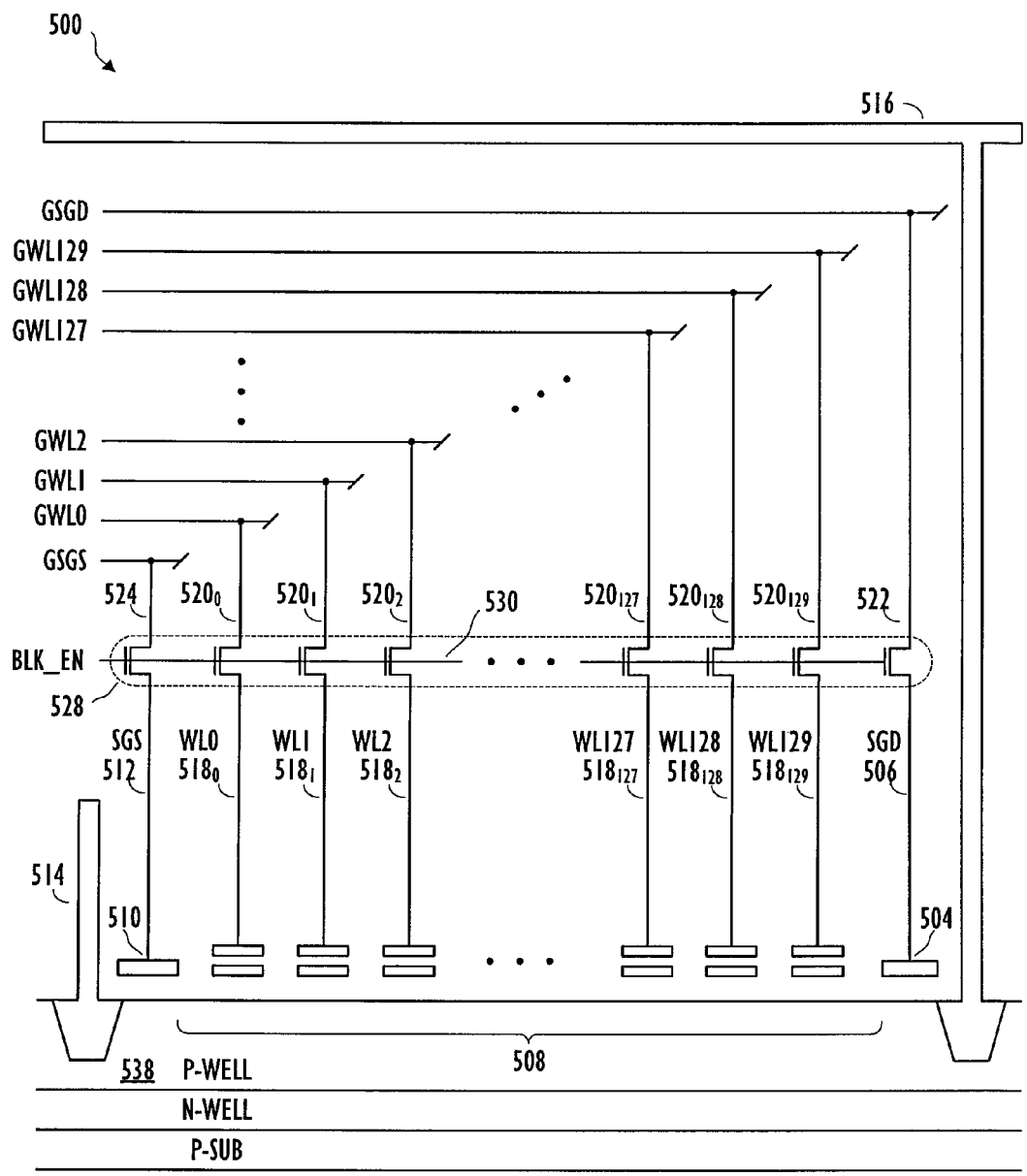
FIG. 5 shows a single NAND string of memory cells and string driver circuitry.

Various embodiments of the present disclosure will be discussed by way of reference to FIG. 5. FIG. 5 shows a single NAND string of memory cells 508 coupled to both local signal lines (e.g., SGS line 512, WL0-WL129 518, SGD line 506) and global signal lines (e.g., GSGS 524, GWL0-GWL129 520, GSGD 522) by string driver transistors 528. The gates of the string driver transistors 528 are connected by a common block enable signal BLK_EN 530. The NAND string 508 is coupled to a bit line 516 through a drain select gate 504 and is also coupled to a source line 514 by a source select gate 510. According to one or more embodiments of the present disclosure, edge word lines WL0 $518_0$ and WL129 $518_{129}$ act as "dummy" word lines in that the memory cells coupled to these word lines are not used for data storage. Instead, these dummy word lines are allowed to float during at least a portion of an erase operation performed on the NAND string 508 according to one or more embodiments of the present disclosure. It should be noted that various embodiments of the present disclosure might utilize different numbers of word lines, including different numbers of dummy word lines, per NAND string and are not limited to having word lines WL0-WL129 518 shown in FIG. 5, for example.

Figure 6:
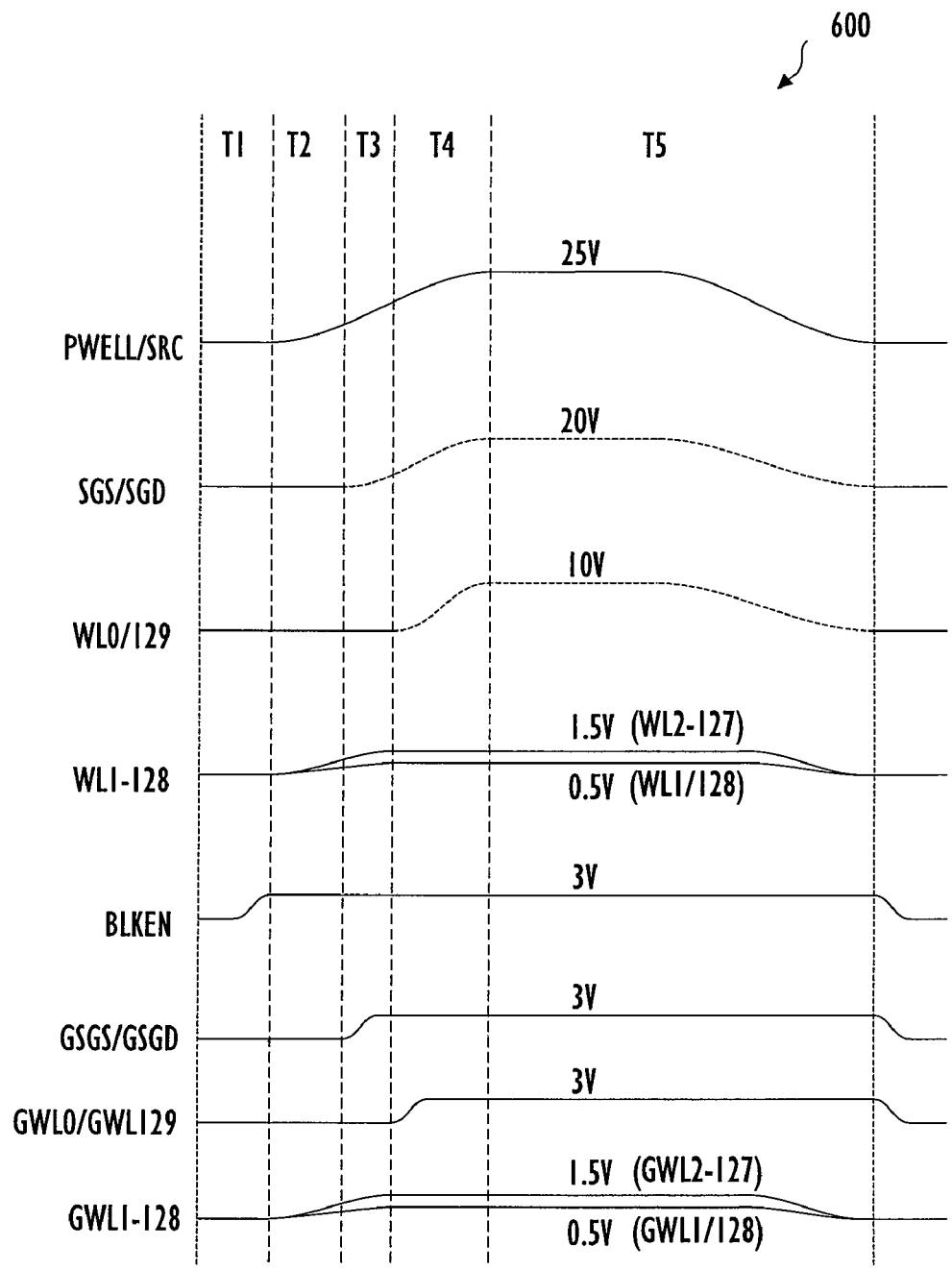
FIG. 6 illustrates a waveform plot of bias potentials during an erase operation according to an embodiment of the present disclosure.

FIG. 6 illustrates a plot of bias voltages 600 applied to the NAND string 508 during an erase operation according to one or more embodiments of the present disclosure. The waveform plot of FIG. 6 is shown divided up into multiple time ranges, such as times T1-T5. These time ranges are not meant to be limiting but are shown to aid in describing biasing conditions occurring during an erase operation according to one or more embodiments of the present disclosure. The absolute and/or relative biasing magnitude of the waveforms shown are also not intended to be limiting but again are intended to aid in the understanding of various embodiments according to the present disclosure. Waveforms of FIG. 6 having dashed line segments are intended to indicate a floating bias level of the particular waveform during that particular segment. FIG. 7 shows a table of bias conditions arranged by time ranges (e.g., T1-T5) and signal names corresponding to those illustrated by the waveforms of FIG. 6.

Figure 8:
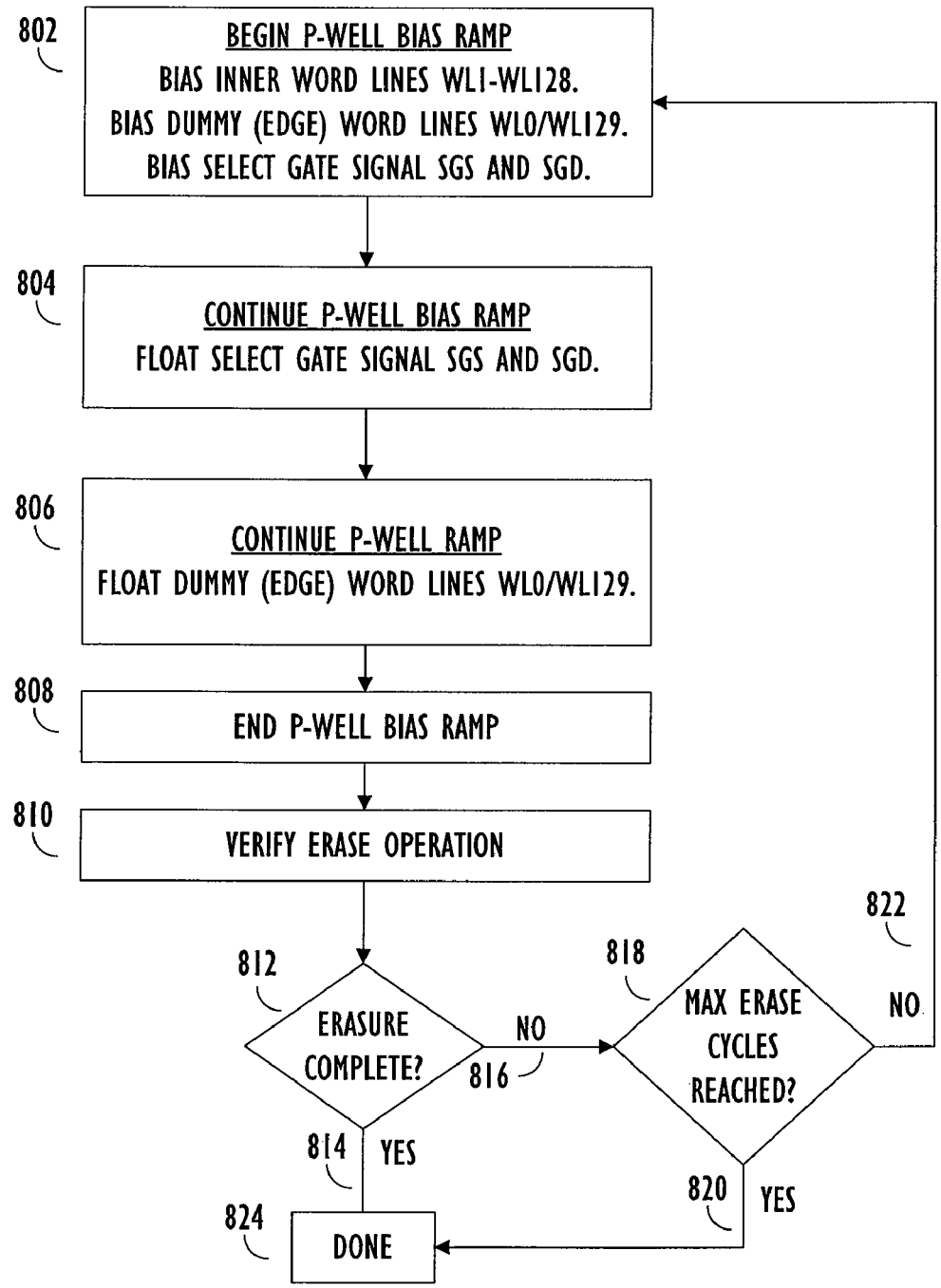
FIG. 8 shows a flowchart illustrating an erase operation according to an embodiment of the present disclosure.

FIG. 8 illustrates a flowchart of an erase operation according to one or more embodiments of the present disclosure and corresponding to the waveforms illustrated in FIG. 6, the biasing conditions shown by way of example in the table of FIG. 7 and imposed on the NAND string 508 of FIG. 5. The erase operation begins 802 by applying a ramped (e.g., increasing) bias voltage on the p-well 538 of the NAND string of memory cells 508, as illustrated during time T2 of FIG. 6, for example. The initial bias potential of the increasing bias potential might be 0V, for example. Additional signals are biased to particular levels during step 802 as illustrated by FIG. 6 and the table of FIG. 7. For example, the SGS line 512, SGD line 506 and the edge word lines (e.g., dummy word lines) $518_0$, $518_{129}$ are biased to 0V. Inner word lines $518_1$ and $518_{128}$ are biased to 0.5V. Remaining inner word lines, such as $518_{2-127}$, are biased to a level of 1.5V, for example. These initial biasing operations 802 might occur concurrently with the start of the ramped bias potential placed on the well in which the memory cells are formed, or might occur prior to applying the ramped well bias, for example.

As the p-well bias ramp continues to increase from its initial bias potential, the SGS line 512 and SGD line 506 are allowed to float 804 in response to the p-well bias reaching a first particular release bias potential, such as 5V, for example. FIG. 7 during time T3 shows that the BLK_EN signal 530 is biased at 3V. By driving the GSGS line 524 and GSGD line 522 bias levels to 3V as shown in FIG. 7, the associated string driver transistors 528 are deactivated. This results in a high impedance (e.g., floating) condition of the select gate SGS line 512 and SGD line 506. The string drivers coupled to the local word lines WL0-WL129 518 remain in an activated state.

Following the release of the SGS and SGD lines to a floating state and during the continued increase of the p-well bias, the edge word lines WL0/WL129 $518_{0,129}$ are also allowed to float 806. The release of the edge word lines may occur in response to the p-well reaching a second release bias potential, such as 15V, for example. According to various embodiments of the present disclosure, the first and second release potentials have levels below which stored charge would begin to be removed from a memory cell (e.g., experiencing an erase effect), for example. As shown in FIG. 7, during time T4 the BLK_EN signal 530 continues to be biased at 3V. By driving the GWL0 and GWL129 global word lines $518_{0,129}$ from 0V to 3V, their associated string driver transistors are also disabled. This results in the high impedance state of the edge (e.g., dummy) local word lines WL0 $518_0$ and WL129 $518_{129}$. Thus, the various string driver transistors 528 shown in FIG. 5 can be controlled (e.g., enabled, disabled) by selectively biasing their control gates and/or their associated global signal lines according to various embodiments of the present disclosure, for example. The high impedance (e.g., floating) state of the local SGS/SGD lines and the local edge (e.g., dummy) word lines WL0/WL129 cause these floating lines to be coupled up to a potential nearer the 25V present on the source line 514 and the bit line 516 at the completion of the p-well ramp 808. For example, the floating lines might be coupled up to a potential of 20V on the SGS/SGD line and 10V on the edge word lines WL0/WL129. Thus, the potential difference between the word line coupled to the first utilized memory cell (e.g., memory cells coupled to word lines WL1/WL127) and the adjacent dummy word line has been reduced from what occurs such as discussed above with respect to FIG. 2, for example. The final ramped p-well bias potential (e.g., target bias potential of the increasing bias potential) may vary from 25V according to one or more embodiments of the present disclosure. According to one or more embodiments, the target bias potential of the increasing bias potential is a potential which can cause charge to be removed from a memory cell, such as causing a memory cell to be erased as discussed above, for example.

Following the erase operation 802 through 808 shown in FIG. 8, a verify operation 812 can be performed to determine if the selected memory cells have been successfully erased. If the selected memory cells have passed the erase verify operation 814, the erase operation is complete 824. If one or more selected memory cells have not been successfully erased 816, a check is performed 818 to determine if a maximum number of erase operations have been performed on the selected memory cells. If a particular maximum number of erase operations have not been completed 822, then additional erase operations are performed. If a maximum number of erase operations have been performed 820, a failure of one or more of the selected memory cells may be assumed and the memory cells may be marked as defective, for example.

Figure 9:
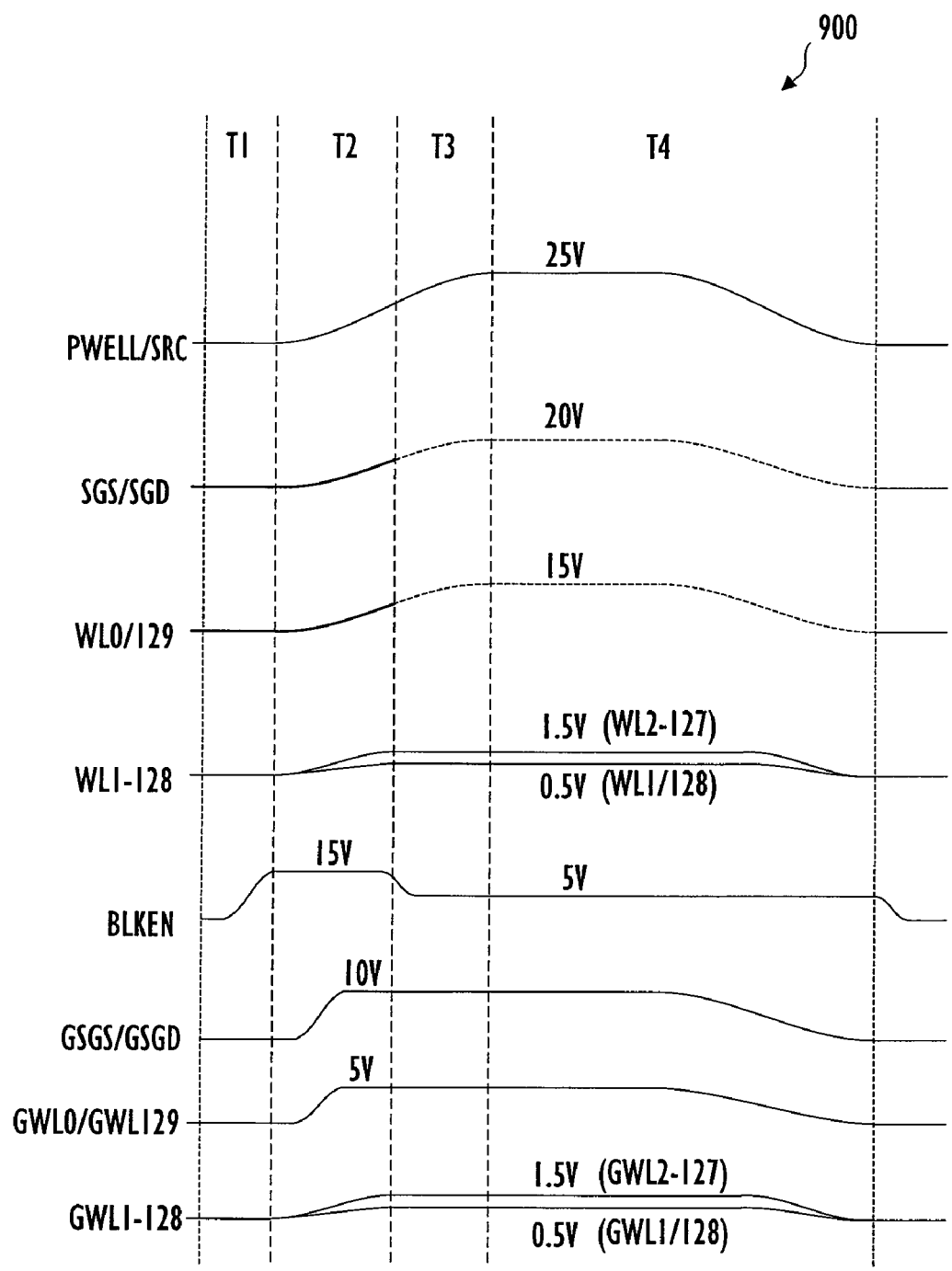
FIG. 9 illustrates a waveform plot of bias potentials during an erase operation according to an embodiment of the present disclosure.
Figure 11:
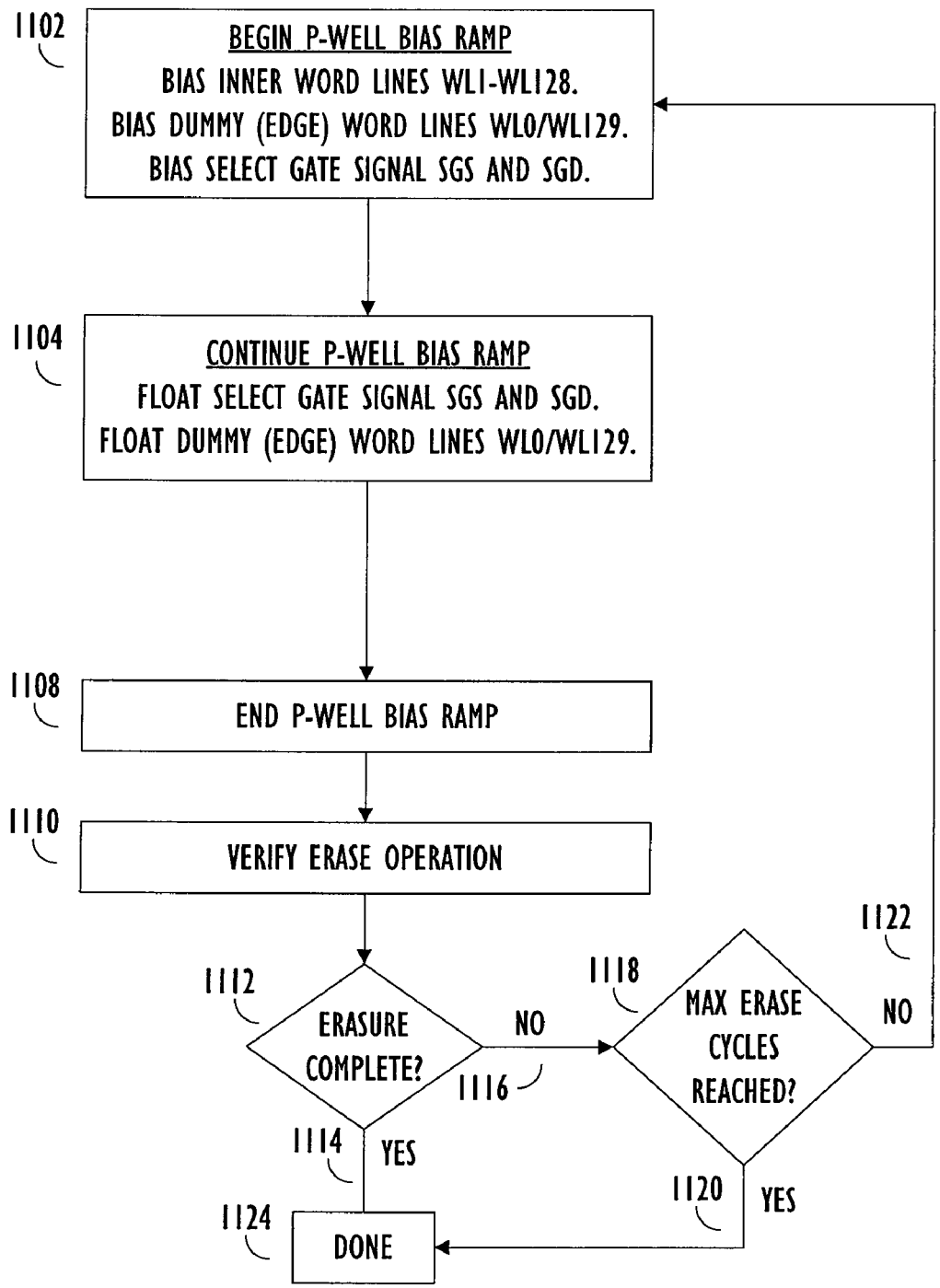
FIG. 11 shows a flowchart illustrating an erase operation according to an embodiment of the present disclosure.

FIGS. 9, 10 and 11 along with reference to FIG. 5 illustrate an alternate erase operation according to one or more embodiments of the present disclosure. FIG. 9 illustrates a plot of bias voltages 900 applied to the NAND string 508 during an erase operation according to one or more embodiments of the present disclosure. The waveform plot of FIG. 9 is shown divided up into multiple time ranges, such as times T1-T4. These time ranges are not meant to be limiting but are shown to aid in describing biasing conditions occurring during an erase operation according to various embodiments of the present disclosure. The absolute and/or relative biasing magnitude of the waveforms shown are also not intended to be limiting but again are intended to aid in the understanding of various embodiments according to the present disclosure. Waveforms of FIG. 9 having dashed lines are intended to indicate a floating bias level of the particular waveform. FIG. 10 shows a table of bias conditions arranged by time ranges (e.g., T1-T4) and signal names corresponding to those illustrated by the waveforms of FIG. 9.

FIG. 11 illustrates a flowchart of an erase operation according to one or more embodiments of the present disclosure and corresponding to the waveforms illustrated in FIG. 9, the biasing conditions shown in the table of FIG. 10 and imposed on the NAND string 508 of FIG. 5. The erase operation begins 1102 by applying a ramped (e.g., increasing) bias voltage to the p-well 538 of the NAND string of memory cells 508, as illustrated during time T2 of FIG. 9, for example. Additional signals are also biased to particular levels during step 1102 as illustrated by FIG. 9 and the table of FIG. 10. For example, the SGS line 512, SGD line 506 and the edge word lines (e.g., dummy word lines) $518_0$, $518_{129}$ are biased to 0V. Inner word lines $518_1$ and $518_{128}$ are biased to 0.5V. Remaining inner word lines, such as $518_{2-127}$, are biased to a level of 1.5V. These initial biasing conditions might occur concurrently with the start of the ramped bias potential placed on the substrate or might occur prior to applying the ramped well bias, for example.

According to one or more embodiments as illustrated by FIGS. 9, 10 and 11, as the p-well bias ramp continues to be driven higher towards its target bias potential, the SGS line 512, SGD line 506, and the edge word lines WL0/WL129 $518_{0,129}$ are allowed to float 1104. For example, as shown in FIG. 10, during time T2 the BLK_EN signal 530 is biased at 15V, the GSGS/GSGD lines are biased at 10V and the GWL0/GWL129 word lines are biased to 5V. This bias condition results in the string drivers coupled to the local SGS/SGD and local edge word lines WL0/WL129 to be activated. Thus, the local SGS/SGD lines are driven to 10V and the local edge word lines WL0/WL129 to be driven to 5V as shown in the table of FIG. 10 during time T2. In order to float the SGS/SGD and WL0/WL129 lines as shown in step 1104, the BLK_EN line bias is adjusted (e.g., reduced) as shown during time T3 of FIG. 10, for example. By reducing the BLK_EN bias level from 15V to 5V the string drivers coupled to the SGS/SGD and WL0/WL129 are deactivated leaving the SGS/SGD and WL0/WL129 lines to float in a high impedance state. Thus, according to the one or more embodiments represented by FIGS. 9, 10 and 11, the SGS/SGD lines and the edge word lines WL0/WL129 are floated substantially simultaneously during the application of the increasing well bias potential. For example, the SGS/SGD and WL0/WL129 lines might be released (e.g., floated) when the ramped well bias potential reaches a particular bias release potential, for example. As discussed above with respect to FIG. 8, the particular release potential is less than an erase potential according to one or more embodiments of the present disclosure.

The high impedance (e.g., floating) state of the local SGS/SGD lines and the local edge (e.g., dummy) word lines WL0/WL129 cause these floating lines to be coupled up to a potential nearer the final 25V target bias potential present on the source 514 and bit line 516 at the completion of the p-well ramp 1108. For example, the floating lines might be coupled up to a potential of 20V on the SGS/SGD line and 15V on the edge word lines WL0/WL129 at the completion of the well bias ramp 1108. Thus, the potential difference between the word lines coupled to the first utilized memory cells (e.g., memory cells coupled to word lines WL1/WL127) and the adjacent dummy word line WL0/WL129, respectively, have been reduced from what occurs such as discussed above with respect to FIG. 2, for example.

Following the erase operation 1102 through 1108 shown in FIG. 11, a verify operation 1112 may be performed to determine if the selected memory cells have been successfully erased. If the selected memory cells pass the erase verify operation 1114, the erase operation is complete 1124. If one or more selected memory cells have not been successfully erased 1116, a check is performed 1118 to determine if a maximum number of erase operations have been performed on the selected memory cells. If a particular maximum number of erase operations have not been performed 1122, additional erase operations such as 1102 through 1108 are repeated. If a maximum number of erase operations have been performed 1120, a failure of one or more of the selected memory cells may be assumed and the memory cells may be marked as defective, for example.

Figure 12:
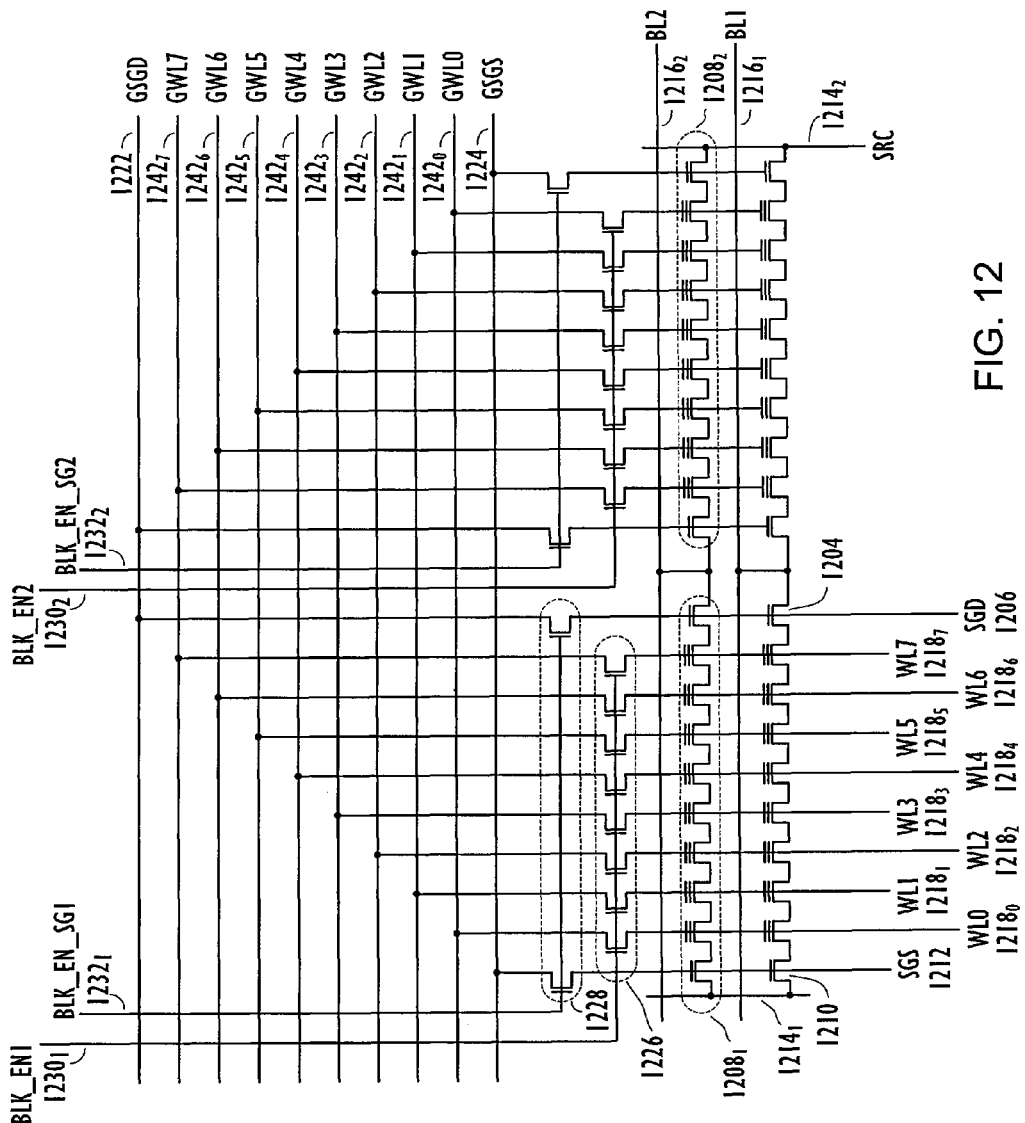
FIG. 12 illustrates a schematic representation of a plurality of NAND strings of memory cells and string driver circuitry according to an embodiment of the present disclosure.

FIG. 12 illustrates a schematic representation of a plurality of NAND strings of memory cells 1208 coupled to local control signals SGS/SGD 1212, 1206 and local word lines 1218 according to one or more embodiments of the present disclosure. Global control signals GSGS/GSGD 1224, 1222 and global word lines GWL0-GWL7 1242 are also illustrated. The global signals GSGS/GSGD are coupled to their respective local signals SGS/SGD by string drivers 1228. Global word lines GWL0-GWL7 1242 are coupled to their respective local word lines WL0-WL7 1218 by a different set of string drivers 1226. This allows for independent control of the string drivers coupled to the local SGS/SGD lines and the string drivers coupled to the local word lines WL0-WL7 1218. String drivers 1226 are controlled by the block enable signals such as BLK_EN1 $1230_1$ and BLK_EN2 $1230_2$. Typically, when one block enable signal is active, such as BLK_EN1 $1230_1$, the adjacent block enable signal $1230_2$ is not active and vice versa. For example, NAND string $1208_1$ might be part of a first block of memory and $308_2$ might be part of a different block of memory. String drivers 1228 are controlled by the block enable select gate signals such as BLK_EN_SG1 $1232_1$ and BLK_EN_SG2 $1232_2$. Again, when one block enable signal is active, such as BLK_EN_SG1 $1232_1$, the adjacent block enable signal $1232_2$ is not active and vice versa. Signals GSGD 1222, GWL7-GWL0 1242 and GSGS 1224 are referred to as global signals in that these signals are coupled to multiple blocks of memory cells. Signals SGS 1212, WL7-WL0 1218 and SGD 1206 are referred to as local signals in that these signals are coupled to a single block of memory cells, for example. Thus, the local signals SGS/SGD 1212, 1206 are coupled to their respective global signals GSGS/GSGD 1224, 1222 by the string drivers 1228 and local word line signals 1218 are coupled to their respective global word line signals 1242 by string drivers 1226. According to one or more embodiments, the source select gate 1210 and the drain select gate 1204 might be implemented using charge storage node cells, such as charge trap or floating gate memory cells, such as discussed with respect to FIG. 4, where the charge storage node memory cells have a permanently programmed state.

Additional embodiments of the present disclosure will be discussed by way of reference to FIG. 13 which illustrates the multiple block enable signal structure, such as shown in FIG.

12, for example. FIG. 13 shows a single NAND string of memory cells 1308 coupled to both local signal lines (e.g., SGS line 1312, WL0-WL129 1318, SGD line 1306) and global signal lines (e.g., GSGS 1324, GWL0-GWL129 1320, GSGD 1322). The global signals GSGS/GSGD are coupled to their respective local SGS/SGD signals by string drivers 1328. Global word lines GWL0-GWL129 1320 are coupled to their respective local word lines WL0-WL129 1318 by a separate set of string drivers 1326. This configuration allows for a block enable select gate signal 1332 to control the string drivers coupled to the global and local source/drain signals, such as GSGS/GSGD and SGS/SGD. A separate block enable signal 1330 is then utilized to control string drivers 1326 coupled to word lines, such as the global and local word lines GWL0-GWL129 and WL0-WL129.

According to one or more embodiments of the present disclosure, word lines WL0 $1318_0$ and WL129 $1318_{129}$ are edge word lines that act as "dummy" word lines in that the memory cells coupled to these edge word lines are not used for storage. Instead, these dummy word lines are biased and/or are allowed to float during a portion of an erase operation performed on the NAND string according to one or more embodiments of the present disclosure. Again, various embodiments of the present disclosure might utilize different numbers of word lines, including different numbers of dummy word lines, per NAND string and are not limited to having word lines WL0-WL129 1318 shown in FIG. 13, for example.

Figure 13:
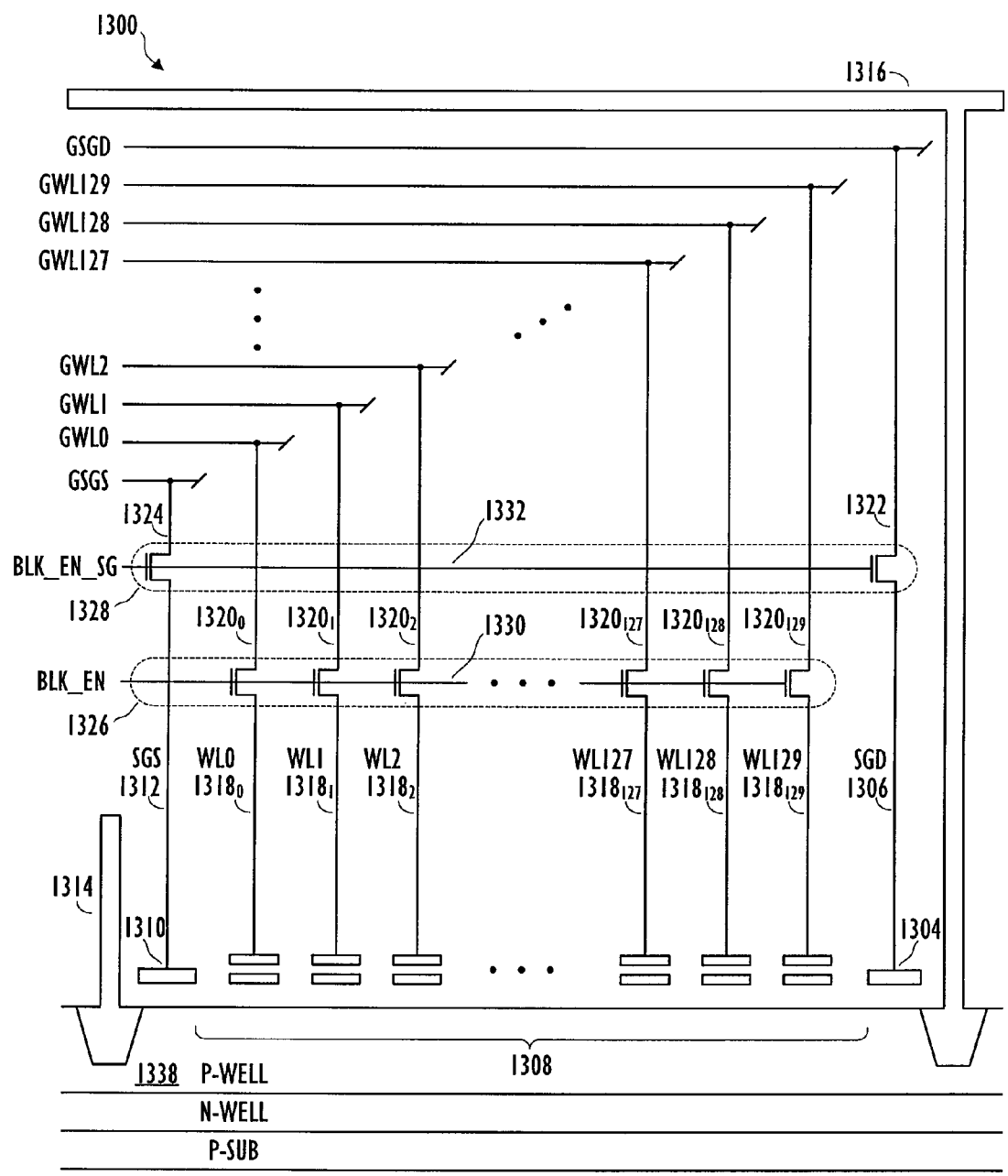
FIG. 13 shows a single NAND string of memory cells and string driver circuitry according to an embodiment of the present disclosure.
Figure 14:
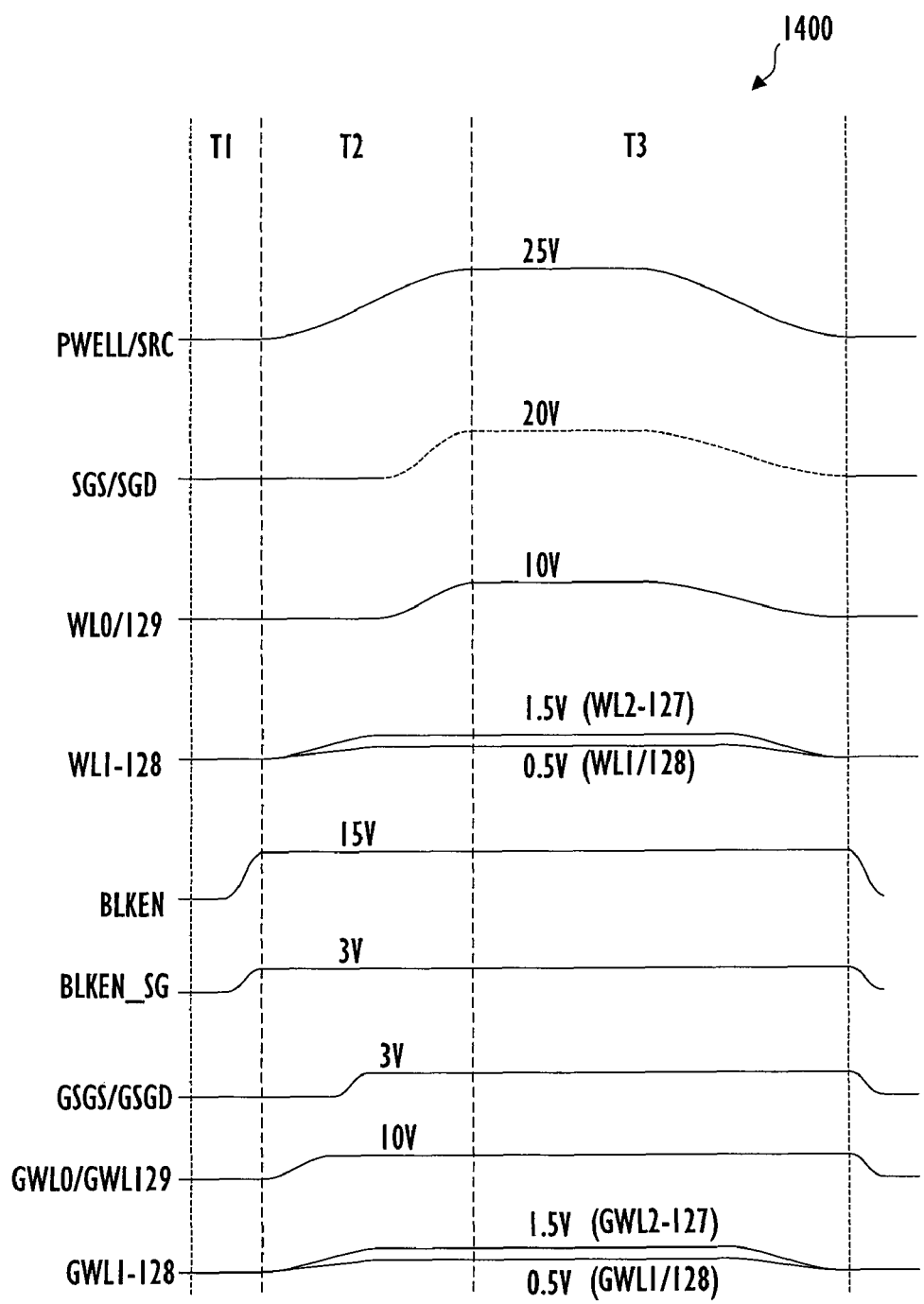
FIG. 14 illustrates a waveform plot of bias potentials during an erase operation according to an embodiment of the present disclosure.
Figure 16:
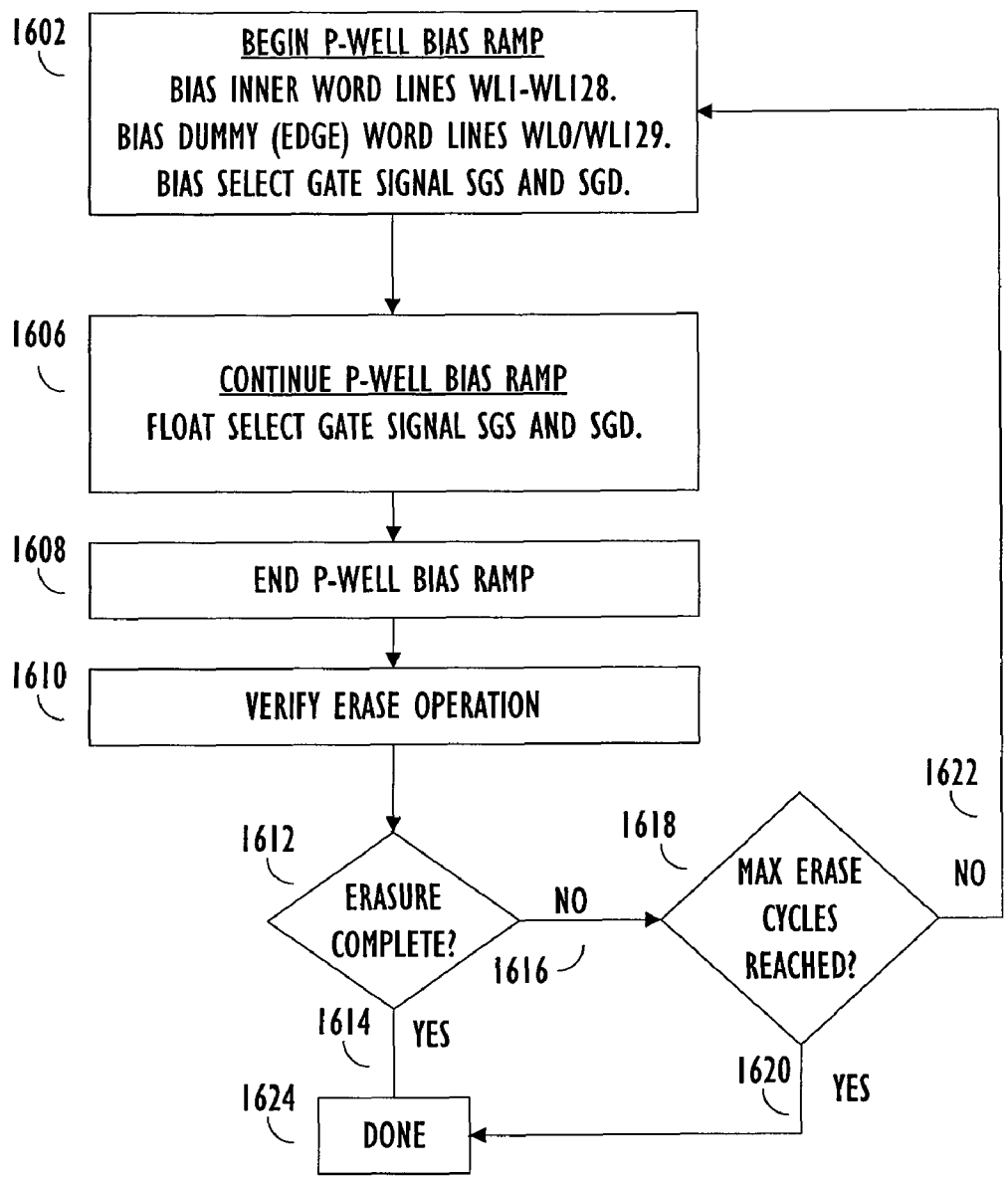
FIG. 16 shows a flowchart illustrating an erase operation according to an embodiment of the present disclosure.

FIGS. 14, 15 and 16 along with reference to FIG. 13 illustrate an additional alternate erase operation according to one or more embodiments of the present disclosure. FIG. 14 illustrates a plot of bias voltages 14 applied to the NAND string 1308 during an erase operation according to one or more embodiments of the present disclosure. The waveform plot of FIG. 14 is shown divided up into multiple time ranges, such as times T1-T3. These time ranges are not meant to be limiting but are shown to aid in describing biasing conditions occurring during an erase operation according to various embodiments of the present disclosure. The absolute and/or relative biasing magnitude of the waveforms shown are also not intended to be limiting but again are intended to aid in the understanding of various embodiments according to the present disclosure. Waveforms of FIG. 14 having dashed lines are intended to indicate a floating bias level of the particular waveform. FIG. 15 shows a table of bias conditions arranged by time ranges (e.g., T1-T3) and signal names corresponding to those illustrated by the waveforms of FIG. 14.

FIG. 16 illustrates a flowchart of an erase operation according to one or more embodiments of the present disclosure and corresponding to the waveforms illustrated in FIG. 14, the biasing conditions shown in the table of FIG. 15 and imposed on the NAND string 1308 of FIG. 13. The erase operation begins 1602 by applying a ramped (e.g., increasing) bias voltage on the p-well 1338 of the NAND string of memory cells 1308, as illustrated during time T2 of FIG. 14, for example. Additional signals are also biased to particular levels during step 1602 as illustrated by FIG. 14 and the table of FIG. 15. For example, the SGS line 1312 and SGD line 1306 are biased to 10V. The edge word lines (e.g., dummy word lines) WL0/WL129 $1318_0$, $1318_{129}$ are also biased to 0V. Inner word lines WL1/WL128 $1318_1$, $1318_{128}$ are biased to 0.5V. The remaining inner word lines, such as WL2-WL127 $1318_{2\text{-}127}$, are biased to a level of 1.5V. These initial biasing conditions might occur concurrently with the start of the ramped bias potential placed on the well in which the memory cells are formed, or might occur prior to applying the ramped bias, for example.

According to one or more embodiments as illustrated by FIGS. 14, 15 and 16, as the p-well bias ramp continues to be driven higher, such as during time T2 of FIG. 14, the SGS line 1312 and SGD line 1306 are allowed to float 1606. For example, as shown in the table of FIG. 15, during time T2 the BLK_EN_SG signal 530 is biased at 3V, the GSGS and GSGD lines, originally biased to 0V are then biased to 3V. This bias condition results in the string drivers 1328 coupled to the global GSGS/GSGD and local SGS/SGD lines to be deactivated. Thus, the local SGS/SGD lines are put into a high impedance (e.g., floating) state. The release of the local SGS/SGD lines (e.g., change to high impedance state) might occur when the ramped well bias potential reaches or exceeds a particular bias release potential, for example. According to at least one embodiment, the particular bias release potential should be less than the bias potential needed to cause a memory cell to begin to erase.

The high impedance (e.g., floating) state of the local SGS/SGD lines cause these floating lines to be coupled up to a potential nearer to the final 25V erase potential present on the source 1314 and the bit line 1316 at the completion of the p-well ramp 1608. For example, the floating lines SGS/SGD lines might be coupled up to a potential of 20V. The edge word lines WL0/WL129 are biased to a potential of 10V as shown in FIGS. 14 and 15. Thus, the potential difference between the word line coupled to the first utilized memory cell (e.g., memory cells coupled to word lines WL1/WL127) and the adjacent dummy word line WL0/WL129, respectively, have been reduced from what occurs such as discussed above with respect to FIG. 2, for example. In addition, the potential difference between the dummy word lines (e.g., WL0/WL129) and the floating SGS/SGD lines have also been reduced.

Following the erase operation steps 1602 through 1608 shown in FIG. 11, a verify operation 1612 is performed to determine if the memory cells selected to be erased have been successfully erased. If the selected memory cells have passed the erase verify operation 1614, the erase operation is complete 1624. If one or more selected memory cells have not been successfully erased 1616, a check is performed 1618 to determine if a maximum number of erase operations have been performed. If a particular maximum number of erase operations have not been completed 1622, additional erase operations such as 1602 through 1608 are repeated. If a maximum number of erase operations have been performed 1620, a failure of one or more of the selected memory cells may be assumed and the memory cells may be marked as defective, for example.

Figure 17:
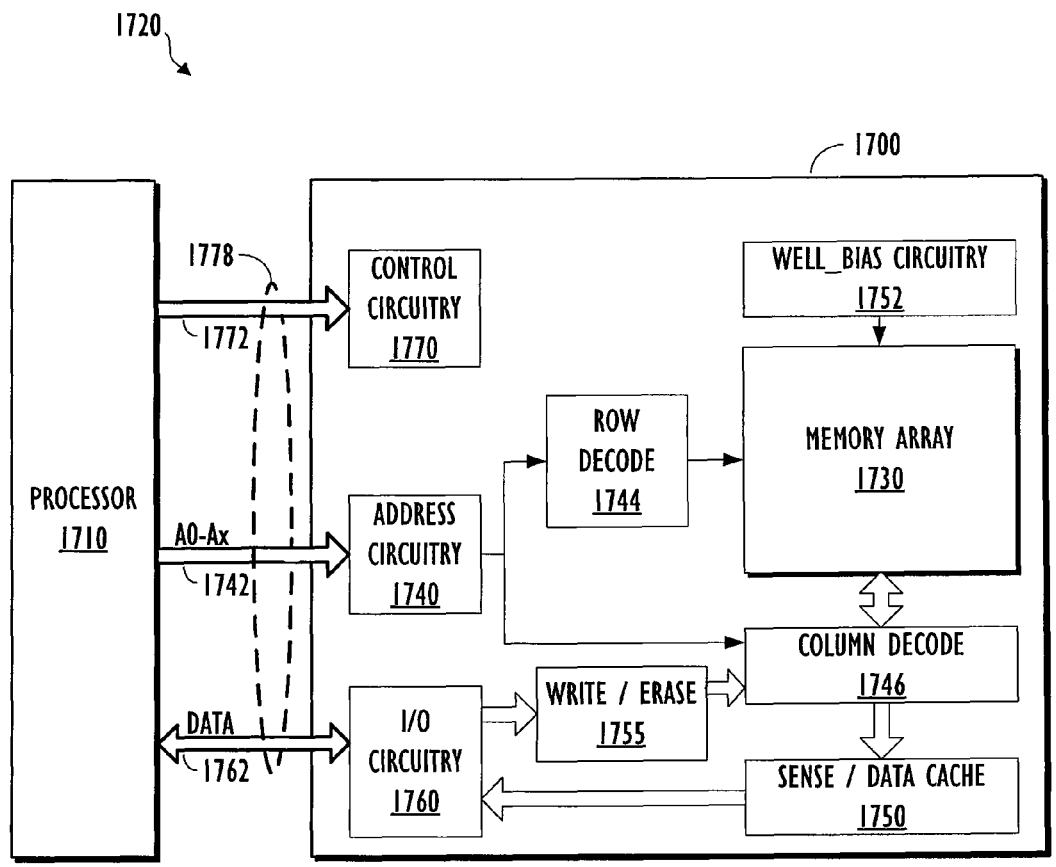
FIG. 17 illustrates a functional block diagram of a system according to an embodiment of the present disclosure.

FIG. 17 is a functional block diagram of an electronic system having at least one memory device according to one or more embodiments of the present disclosure. The memory device 1700 illustrated in FIG. 17 is coupled to a host such as a processor 1710. The processor 1710 may be a microprocessor or some other type of controlling circuitry. The memory device 1700 and the processor 1710 form part of an electronic system 1720. The memory device 1700 has been simplified to focus on features of the memory device that are helpful in understanding various embodiments of the present disclosure.

The memory device 1700 includes one or more arrays of memory cells 1730 that can be logically arranged in banks of rows and columns. Memory array 1730 may comprise SLC and/or MLC memory, for example. According to one or more embodiments, the memory cells of memory array 1730 are flash memory cells. The memory array 1730 might include multiple banks and blocks of memory cells residing on a single or multiple die as part of the memory device 1700. The memory cells of the memory array 1730 may also be adaptable to store varying densities (e.g., MLC (four level) and MLC (eight level)) of data in each cell, for example.

An address buffer circuit 1740 is provided to latch address signals provided on address input connections A0-Ax 1742. Address signals are received and decoded by a row decoder 1744 and a column decoder 1746 to access the memory array 1730. The row decoder circuitry 1744 might also incorporate the string driver control circuitry discussed above according to various embodiments of the present disclosure, for example. It will be appreciated by those skilled in the art, with the benefit of the present description, that the number of address input connections 1742 depends on the density and architecture of the memory array 1730. That is, the number of address digits increases with both increased memory cell counts and increased bank and block counts, for example.

The memory device 1700 reads data in the memory array 1730 by sensing voltage or current changes in the memory array columns using sense/data cache circuitry 1750. The sense/data cache circuitry 1750, in at least one embodiment, is coupled to read and latch a row of data from the memory array 1730. Sense devices such as sense devices 130 discussed with respect to FIG. 1 can also comprise the sense/data cache circuitry 1750, for example. Data input and output buffer circuitry 1760 is included for bi-directional data communication over a plurality of data connections 1762 with the processor 1710. Write/erase circuitry 1755 is provided to write data to or to erase data from the memory array 1730. Well bias circuitry 1752 is coupled to the array 1730 and facilitates biasing of one or more wells (e.g., p-wells) of the memory array 1730 according to various embodiments of the present disclosure. For example, well bias circuitry 1352 can generate the ramped well bias potential discussed according to various embodiments of the present disclosure.

Control circuitry 1770 is configured at least in part to implement various embodiments of the present disclosure, such as facilitating the methods discussed above with respect to FIGS. 5-16, for example. In at least one embodiment, the control circuitry 1770 may utilize a state machine. Control signals and commands can be sent by the processor 1710 to the memory device 1700 over the command bus 1772. The command bus 1772 may be a discrete signal or may be comprised of multiple signals, for example. These command signals 1772 are used to control the operations on the memory array 1730, including data read, data write (e.g., program), and erase operations. The command bus 1772, address bus 1742 and data bus 1762 may all be combined or may be combined in part to form a number of standard interfaces 1778. For example, the interface 1778 between the memory device 1700 and the processor 1710 may be a Universal Serial Bus (USB) interface. The interface 1778 may also be a standard interface used with many hard disk drives (e.g., SATA, PATA) as are known to those skilled in the art.

The electronic system illustrated in FIG. 17 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide methods of managing signal lines during an erase operation. These methods facilitate a reduction in the electric field between particular control signals, such as local and global select gate control signals and local and global word line signals which are coupled to a string of memory cells undergoing an erase operation.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of erasing a string of memory cells, the method comprising:
   biasing first and second control lines to a first bias potential, wherein the first control line is coupled to a select gate coupled to a first end of the string of memory cells, the second control line is coupled to a select gate coupled to a second end of the string of memory cells, and each memory cell of the string of memory cells is coupled to a respective one of a plurality of access lines;
   biasing a first pair of the access lines to a second bias potential wherein each access line of the pair of access lines is coupled to a respective memory cell adjacent to a respective one of the select gates;
   biasing one or more of the remaining access lines to a third bias potential;
   applying a ramping bias potential to channel regions of the string of memory cells; and
   floating the first and second control lines in response to the ramping bias potential reaching a release bias potential between an initial bias potential of the ramping bias potential and a target bias potential of the ramping bias potential.

2. The method of claim 1, wherein floating the first and second control lines in response to a release bias potential comprises floating the first and second control lines in response to a first release bias potential and further comprising floating the first pair of access lines in response to the increasing bias potential reaching a second release bias potential wherein the second release bias potential is greater than or equal to the first release bias potential and where the first release bias potential and the second release bias potential are both less than a bias potential which would cause a memory cell of the string of memory cells to be erased.

3. The method of claim 2, wherein floating the first and second control lines and floating the first pair of access lines further comprises floating the first and second control lines and floating the first pair of access lines substantially simultaneously.

4. The method of claim 2, wherein floating the first pair of access lines further comprises floating the first pair of access lines by disabling a first string driver coupled to one access line of the first pair of access lines and disabling a second string driver coupled to the second access line of the first pair of access lines where disabling the first and second string drivers comprises biasing a block enable line coupled to the first and the second string drivers to a fourth bias potential, biasing a first global access line coupled to the first string driver to a fifth bias potential and biasing a second global access line coupled to the second string driver to a sixth bias potential.

5. The method of claim 1, wherein floating the first and second control lines in response to the ramping bias potential reaching a release bias potential further comprises floating the first and second control lines in response to the ramping bias potential reaching a release bias potential by adjusting a block enable signal to disable a first string driver associated with the first control line and to disable a second string driver associated with the second control line.

6. The method of claim 1, wherein floating the first and second control lines further comprises floating the first and second control lines by disabling a first string driver coupled to the first control line and disabling a second string driver coupled to the second control line where disabling the first and second string drivers comprises biasing a block enable line coupled to the first and the second string drivers to a fourth bias potential, biasing a first global select line coupled to the first string driver to a fifth bias potential and biasing a second global select line coupled to the second string driver to a sixth bias potential.

7. The method of claim 1, wherein biasing the first pair of access lines to a second bias potential further comprises biasing the pair of access lines to a second bias potential where the second bias potential is less than the third bias potential.

8. The method of claim 1, further comprising biasing a second pair of the access lines to a fourth bias potential where each of the second pair of the access lines are coupled to a respective memory cell that is adjacent to a respective one of the memory cells coupled to the first pair of access lines.

9. The method of claim 8, wherein biasing a second pair of the access lines to a fourth bias potential further comprises biasing the second pair of the access lines to the fourth bias potential where the fourth bias potential is less than the third bias potential.

10. A method of erasing a string of memory cells formed in a substrate well and having a select gate coupled to each end of the string where each memory cell is coupled to an access line and each select gate is coupled to a control line, the method comprising:
biasing control lines coupled to the select gates to a first bias potential;
biasing access lines coupled to memory cells adjacent to the select gates to a second bias potential;
biasing one or more remaining access lines to a third bias potential;
applying a ramped bias potential to the substrate well; and
floating the control lines in response to the ramped bias potential reaching a first release bias potential and floating the access lines coupled to the memory cells adjacent to the select gates in response to the ramped bias potential reaching a second release bias potential;
wherein the first release bias potential is less than or equal to the second release bias potential.

11. The method of claim 10, further comprising biasing one or more access lines coupled to memory cells adjacent to the memory cells which are adjacent to the select gates to a fourth bias potential.

12. The method of claim 11, wherein biasing one or more access lines coupled to memory cells adjacent to the memory cells which are adjacent to the select gates to a fourth bias potential further comprises biasing one or more access lines coupled to memory cells adjacent to the memory cells which are adjacent to the select gates to a fourth bias potential where the fourth bias potential is less than the third bias potential.

13. The method of claim 10, wherein floating the access lines coupled to the memory cells adjacent to the select gates in response to the ramped bias potential reaching a second release bias potential further comprises floating the access lines coupled to the memory cells adjacent to the select gates in response to the ramped bias potential reaching a second release bias potential where the second release bias potential is less than a memory cell erase potential.

14. A memory device, comprising:
an array of memory cells formed in a common semiconductor well and logically arranged in rows and in columns wherein each column comprises one or more strings of memory cells and where memory cells of a common row are coupled by a common access line;
one or more first select gates each coupled to a first end of a respective string of memory cells and a first control line;
one or more second select gates each coupled to a second end of a respective string of memory cells and a second control line;
one or more pairs of dummy memory cells wherein each pair of dummy memory cells comprises a memory cell adjacent to a respective first select gate and a memory cell adjacent to a respective second select gate;
well bias circuitry, wherein the well bias circuitry is configured to apply a ramping bias potential to the semiconductor well; and
control circuitry, wherein the control circuitry is configured to bias the first control line and the second control line to a first bias potential, bias access lines coupled to the dummy memory cells to a second bias potential, bias one or more remaining access lines coupled to each string to a third bias potential, and float the first and second control line in response to the semiconductor well bias potential reaching a release bias potential.

15. The memory device of claim 14, further comprising:
a plurality of string drivers each coupled to an associated access line; and
a pair of string drivers each coupled to one of the first and the second control lines;
wherein the plurality of string drivers are coupled to a first block enable line and the pair of string drivers are coupled to a second block enable line; and
wherein the control circuitry is further configured to bias the first and the second block enable lines.

16. The memory device of claim 14, wherein the control circuitry is further configured to float the access lines coupled to the dummy memory cells in response to the semiconductor well bias potential reaching a second release bias potential.

17. The memory device of claim 16, wherein the second release bias potential is less than a potential adapted to remove charge from a memory cell of the array of memory cells.

18. The memory device of claim 14, wherein the dummy memory cells of each string comprise memory cells not utilized for data storage.

19. The memory device of claim 14, wherein the first select gates and second select gates each comprise a charge storage node transistor and where each charge storage node transistor is in a programmed state and does not erase during an erase operation performed on the string of memory cells coupled to the select gates.

20. The memory device of claim 14, wherein the first and second bias potentials are 0V.

21. The memory device of claim 14, wherein the first bias potential is 0V, the second bias potential is 10V and the third bias potential is 1.5V.

22. A memory device comprising:
one or more strings of memory cells formed in a substrate well where each memory cell of each string is coupled to an access line and each string comprises N series connected memory cells; and
control circuitry, wherein the control circuitry is configured to bias access lines coupled to the first and Nth memory cells of a string to a first bias potential, bias access lines coupled to the second and N-1 memory cells of the string to a second bias potential, bias access lines coupled to the third and N-2 memory cells of the string to a third bias potential, apply a ramping bias potential to the substrate well and float access lines coupled to the first and Nth memory cell of a string in response to the substrate well bias potential reaching a first release bias potential;

wherein the ramping bias potential is applied to the substrate well substantially concurrently with or subsequent to the application of the first, second and third bias potentials to the string of memory cells.

23. The memory device of claim 22, wherein the first and the Nth memory cells of each string act as select gates for each string of memory cells.

24. The memory device of claim 22, wherein each string of memory cells further comprises a first select gate coupled to a first end of a string and a second select gate coupled to a second end of a string where each select gate is coupled to an associated control line.

25. The memory device of claim 24, wherein the control circuitry is further configured to bias the control lines associated with the first and second select gates to a fourth voltage substantially concurrently with the application of the first, second and third bias potentials and where the control circuitry is further configured to float the control lines in response to the substrate well bias potential reaching a second release bias potential where the second release potential is less than or equal to the first release potential and where the first release bias potential and the second release bias potential are both less than a bias potential which would cause a memory cell of the string of memory cells to be erased.

26. The memory device of claim 24, further comprising a first plurality of string drivers each of the first plurality having an associated access line and a second plurality of string drivers each having an associated control line.

27. The memory device of claim 26, wherein the first plurality of string drivers are coupled to a first block enable line and the second plurality of string drivers are coupled to a second block enable line and where the control circuitry is further configured to independently bias the first and the second block enable lines.

28. The memory device of claim 27, wherein each of the first plurality of string drivers are coupled to an associated global access line and each of the second plurality of string drivers are coupled to an associated global control line and where the control circuitry is further configured to independently bias each of the global access lines and each of the global control lines.

29. The memory device of claim 22, wherein the first bias potential is 0V, the second bias potential is 0.5V and the third bias potential is 1.5V.

30. The memory device of claim 22, wherein the control circuitry is further configured to apply the ramping bias potential to the substrate well up to a particular target bias potential.

31. The memory device of claim 30, wherein the difference between the particular target bias potential and the third bias potential is a potential which causes one or more memory cells of the string of memory cells to be erased.

32. The memory device of claim 22, wherein the second bias potential is greater than the first bias potential.

33. The memory device of claim 22, wherein the third bias potential is greater than the second bias potential.

* * * * *